(12) United States Patent
Prexl et al.

(10) Patent No.: US 6,894,542 B2
(45) Date of Patent: May 17, 2005

(54) COMPARATOR WITH HYSTERESIS

(75) Inventors: Franz Prexl, Oberding (DE); Wolfgang Steinhagen, Mauern (DE); Ralph Oberhuber, Kumhausen (DE); Kaiser Ulrich, Warstein (DE)

(73) Assignee: Texas Instruments Deutschland, GmbH, Freising (DE)

( * ) Notice: Subject to any disclaimer, the term of this patent is extended or adjusted under 35 U.S.C. 154(b) by 0 days.

(21) Appl. No.: 10/617,433

(22) Filed: Jul. 11, 2003

(65) Prior Publication Data

US 2004/0056691 A1 Mar. 25, 2004

(30) Foreign Application Priority Data

Jul. 22, 2002 (DE) ........................................ 102 33 220

(51) Int. Cl.[7] ................................................ H03K 5/22
(52) U.S. Cl. ........................................ 327/67; 327/205
(58) Field of Search ............................... 327/50, 52–54, 327/57, 64–68, 74–81, 89, 205, 206

(56) References Cited

U.S. PATENT DOCUMENTS

| | | | | |
|---|---|---|---|---|
| 4,642,484 A | * | 2/1987 | Skovmand et al. | 327/89 |
| 4,990,799 A | * | 2/1991 | Weiss | 327/65 |
| 5,334,883 A | * | 8/1994 | Rosenthal | 327/206 |
| 5,656,957 A | * | 8/1997 | Marlow et al. | 327/67 |
| 5,801,553 A | * | 9/1998 | Danstrom | 327/67 |
| 6,208,187 B1 | * | 3/2001 | Callahan, Jr. | 327/206 |
| 6,496,549 B1 | * | 12/2002 | Crawford | 375/320 |

* cited by examiner

Primary Examiner—Minh Nguyen
(74) Attorney, Agent, or Firm—J. Dennis Moore; W. James Brady, III; Frederick J. Telecky, Jr.

(57) ABSTRACT

A comparator with hysteresis which achieves fast switching despite a low current consumption. The comparator comprises a first transistor (M1) and a second transistor (M2) whose gates form the inputs of the comparator. The main current paths of both transistors are connected to each other at one end, with a third transistor (M3) and a fourth transistor (M4) being provided. The gate of the third transistor is connected to the gate of the first transistor and its main current path is circuited between the one end of the main current paths of the first and second transistor and is connected via the main current path of the fourth transistor to the other end of the main current path of the second transistor. The gate of the fourth transistor is connected to the output signal or inverted output signal of the comparator. The comparator in accordance with the invention may be put to use e.g. in an ASK demodulator such as those used in RFID transponders.

13 Claims, 4 Drawing Sheets

COMPARATOR WITH HYSTERESIS

FIELD OF THE INVENTION

The invention relates to a comparator with hysteresis. The comparator is particularly advantageous in an amplitude shift keyed (ASK) demodulator for use in a transponder which receives an ASK input signal which it coverts at its output into a digitally demodulated signal.

BACKGROUND OF THE INVENTION

Comparators find application in a wealth of electronic circuits. When the input signals of the comparators are buried in noise, a comparator with hysteresis is needed as a rule. Comparators with hysteresis are achievable by external or internal positive feedback. Known from prior art is a CMOS comparator employing internal positive feedback as described, for example, in the text book "CMOS Analog Circuit Design" by Phillip E. Allen and Douglas R. Holberg, $2^{nd}$ Edition, Oxford University Press 2002, pages 471 to 475.

The circuit diagram of the comparator with hysteresis as evident from this publication is illustrated in FIG. 1. This prior art comparator comprises a first NMOS-FET M10 whose gate is connected to the first input of the comparator, and a second NMOS-FET M20 whose gate is connected to the second input of the comparator. The sources of the two MOS-FETs are connected to a current source I. The drains of the two NMOS-FETs are connected via the main current paths of PMOS-FETs M30 and M40 to a supply voltage Vcc. The hysteresis is formed by the further PMOS-FETs M50 and M60. PMOS-FET M50 forms with PMOS-FET M30 a current mirror whilst PMOS-FET M60 forms with PMOS-FET M40 a further current mirror. The main current path of PMOS-FET M50 is connected to the main current path of the NMOS-FET M20 whilst the main current path of the PMOS-FET M60 is connected to the main current path of the NMOS-FET M10.

When e.g. the input voltage at input 1 is higher than the input voltage at input 2 a larger current is conducted via the source-drain circuit of the NMOS-FET M10 than via the source-drain circuit of the NMOS-FET M20. The majority of the current of the current source I then flows via Vcc, M30, M10 and current source I to ground whilst via M20 only a minor, or no, flow of current exists. In this arrangement the output signal at the output 70 of the comparator is HI. The gate voltage at the two current mirror transistors M40 and M60 is likewise HI.

As soon as the voltage at input 1, i.e. the gate of the NMOS-FET M10 becomes smaller than that at input 2, i.e. at the gate of NMOS-FET M20, the current flowing via supply voltage Vcc, M50, M20 and I gradually increases, causing the comparator to switch when the current flowing via M50 and M20 corresponds to the current flowing via M40 and M20. For this switching action to occur, the gate capacitance of the transistors M40 and M60, previously HI, needs to be discharged to ground voltage level which takes a certain time Dt. If the signals at the inputs of the comparator change in level with a high frequency, a relatively large current I is needed to ensure the continual fast recharging of the gate capacitances of the current mirror transistors M30, M50, M60 and M40. This is why the CMOS comparator known from prior art can only be put to use with high current consumption and at a high switching speed.

SUMMARY OF THE INVENTION

An embodiment of the present invention provides an improved comparator with hysteresis whose current consumption is low even in fast switching.

The present invention provides a comparator with hysteresis of the aforementioned kind which is additionally characterized by a third transistor and a fourth transistor being provided, the gate of the third transistor being connected to the gate of the first transistor and its main current path being circuited between the one end of the main current paths of the first and second transistor and, via the main current path of the fourth transistor, the other end of the main current path of the second transistor, and the gate of the fourth transistor being connected to the output signal or inverted output signal of the comparator.

The comparator in accordance with the invention eliminates the current mirrors as used in prior art and so avoiding continual recharging of the gate capacitances of these current mirrors, in thus achieving a low current consumption even at high switching frequencies.

BRIEF DESCRIPTION OF THE DRAWINGS

The invention will now be detailed by way of an example with reference to the drawing in which.

DETAILED DESCRIPTION OF THE DRAWINGS

Figure 1:
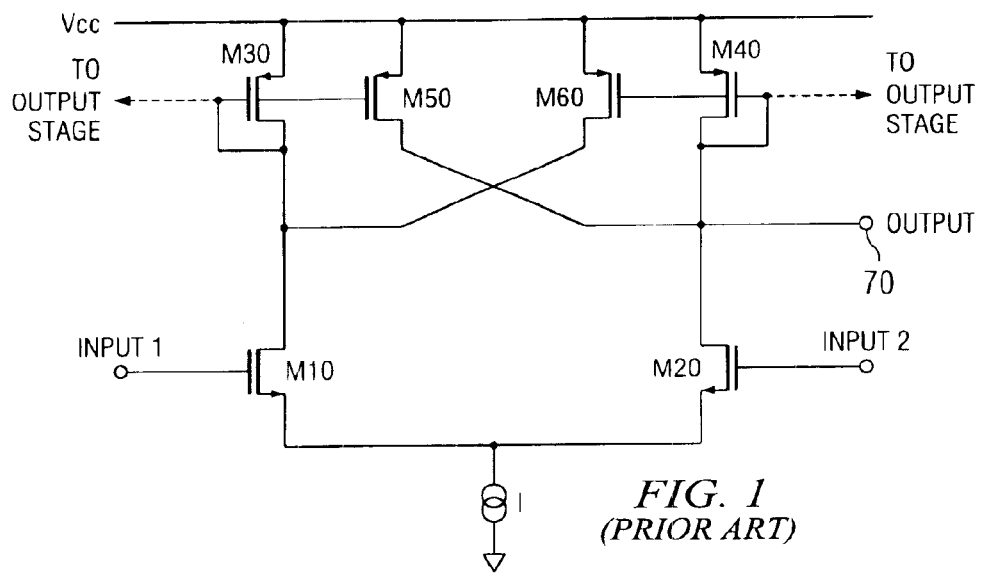
FIG. 1 is a circuit diagram of a prior art comparator with hysteresis employing internal positive feedback.

FIG. 1 shows a prior art comparator with hysteresis as discussed in the background description.

Figure 2:
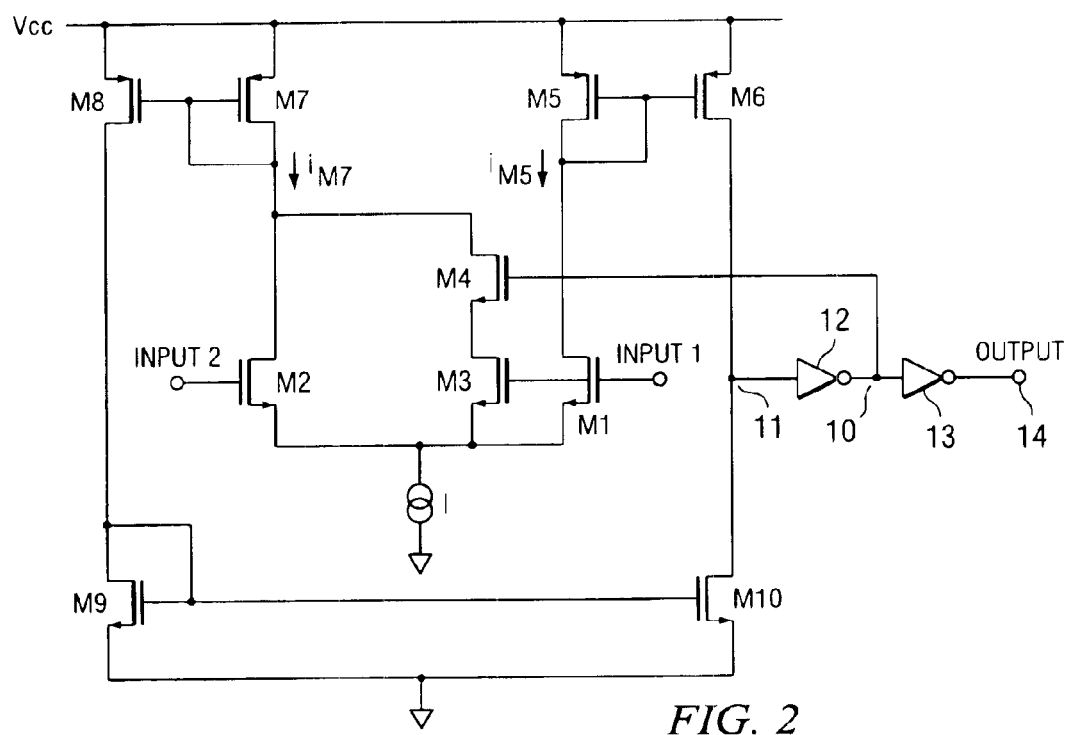
FIG. 2 is a circuit diagram of a first embodiment of a comparator with hysteresis in accordance with the invention.

FIG. 2 shows the circuit diagram of a first embodiment of a comparator with hysteresis in accordance with the invention.

The configuration of the comparator with hysteresis as shown in FIG. 2 will now be detailed.

Referring now to FIG. 2 there is illustrated the comparator with hysteresis in accordance with the invention comprising a first input MOS-FET M1 (N type) whose gate forms the first input of the comparator. Provided in addition is a second MOS-FET M2 (N type) whose gate forms the second input of the comparator. The sources of the first MOS-FET M1 and second MOS-FET M2 are connected to each other, the connecting point of which is connected to a current source I connected to ground.

Provided, in addition, is a third MOS-FET M3 (N type) whose source is connected to the source of the first MOS-FET M1 whilst its gate is connected to the gate of the first MOS-FET M1. The width/length ratio of the third MOS-FET M3 is smaller than the width/length ratio of the first MOS-FET M1.

The drain of the third MOS-FET M3 is connected to the source of the fourth MOS-FET M4 (N type) whose drain is connected to the drain of the second MOSFET M2 whilst the gate of the fourth MOS-FET M4 is connected to the invert of the output signal of the comparator at circuit point 10.

Provided further is a fifth MOS-FET M5 (P type) whose drain is connected to the drain of the first MOS-FET M1 whilst its source is connected to the supply voltage Vcc. The gate of the fifth MOS-FET M5 is connected to its drain as well as to the gate of a sixth MOS-FET M6 (P type) whose source is connected to the supply voltage Vcc and which together with the fifth MOS-FET M5 forms a current mirror.

Further provided is a seventh MOS-FET M7 (P type) whose drain is connected to the drain of the second MOS-FET M2 whilst its source is connected to the supply voltage Vcc and its gate is connected to its drain as well as to the gate of an eighth MOS-FET M8 (P type) whose source is connected to the supply voltage Vcc and which forms with the seventh MOS-FET M7 a current mirror. The drain of the eighth MOS-FET M8 is connected to the drain of a ninth MOS-FET M9 (N type) whose source is connected to ground and whose gate is connected to its drain as well as to the gate of a tenth MOS-FET M10 (N type). The source of the tenth MOS-FET M10 is connected to ground whilst its drain is connected at circuit point 11 to the drain of the sixth MOS-FET M6.

The circuit point 11 is connected via a first inverter 12 and a second inverter 13 to the output 14 of the comparator.

The way in which the comparator with hysteresis in accordance with the invention and as shown in FIG. 2 works will now be described.

Assuming firstly that the output of the comparator as shown in FIG. 2 is LO, i.e. a low voltage level appearing at circuit point 14, then the circuit point 10 upstream of the second inverter 13 is HI and the circuit point 11 upstream of the first inverter 12 is LO. In this condition of the comparator the tenth MOS-FET M10 is ON and the sixth MOS-FET M6 is OFF. In addition, the fifth MOS-FET M5, the first MOS-FET M1 and the second MOS-FET M2 are OFF, meaning that no, or only a minor, current flows via the circuit branch M5, M1 and I. Since the voltage level at the circuit point 10 is HI the fourth MOS-FET M4 is ON without any flow of current, however, since the third MOS-FET M3 is OFF. In addition, in this condition of the comparator the voltage level at the gate of the first MOSFET M1 as compared to the voltage level at the gate of the second MOS-FET M2 is relatively small. The MOS-FETs M2, M7, M8, M9 and M10 are all ON so that a current flows via the current path M7, M2 and I to ground.

Assuming now the condition in which the output signal of the comparator at output 14 changes from LO to HI, this change occurs precisely at the point at which the current flow through the source-drain circuit of MOS-FET M5 (iM5) precisely corresponds to the current flow through the source-drain circuit of the seventh MOS-FET M7 (iM7). When the voltage at the gate of the second MOSFET M2 is gradually decreased and the voltage at the gate of the first MOS-FET M1 is gradually increased, then the current flow through the circuit branch M5, M1 and I gradually increases. Since together with the first MOS-FET M1 also the third MOS-FET M3 is ON when the voltage at the gate of first MOS-FET M1 increases, the current flow branched from iM7 via the circuit branch M4, M3 and I also increases. This results in the output signal at output 14 of the comparator changing from LO to HI at a lower voltage at the gate of the second MOS-FET M2 than would be the case in a circuit not including the third MOS-FET M3 and fourth MOS-FET M4. The current iM5 does not equal current iM7 until lower voltages exist at the gate of M2, resulting in the voltage hysteresis of the comparator.

Contrary to the prior art comparator with hysteresis as shown in FIG. 1 the gate capacitances of M7, M8 are now not discharged since a certain current iM5 or iM7 always flows to permit very fast switching of the comparator even with low currents. The gate capacitance of transistor M5 floats, i.e. corresponding to the prior art it is at least not charged to an opposite voltage level so that, in this case too, faster switching of the comparator is promoted.

It is assumed in the following that the comparator is operated with a very low constant current I whereby all MOS-FETs are operated with weak inversion.

Once the voltage applied to the gate of the second MOS-FET M2 has dropped to a critical value, the output changes from LO to HI so that the majority of the current now flows via MOS-FETs M5, M1 and I to ground. Since circuit point 10 is now LO, the fourth MOS-FET M4 is OFF and there is no further flow of current via the current path M7, M4, M3 and I.

Transistor M6 is now ON and transistor M10 OFF so that likewise the MOS-FETs M2, M7, M8, M9 and M10 have only a very low, or no, flow of current.

Considering the case of wanting to now again switch the output of the comparator from HI to LO, the voltage at the gate of second MOS-FET M2 needs to increase to the extent that the currents iM5 and iM7 are again equal. Here, there is no difference to a circuit not including the third MOS-FET M3 and fourth MOS-FET M4, since M4 is now OFF. This is why the voltage at the gate of MOS-FET M2 needs to be the same at the switching point as in a circuit corresponding to that as shown in FIG. 2 but without M3 and M4.

Assuming that all transistors are operated with weak inversion and are the same in length, then the hysteresis voltage is given by the following equation $$V_{Hysteresis} = \frac{n \cdot kT}{q} \cdot \ln\left(\frac{W2}{W1} \cdot \frac{1}{\left(1 - \frac{W3}{W1}\right)}\right), \quad (1)$$

where n is a capacitance ratio as described e.g. on page 269 of the book "VLSI Design" by K. Hoffmann, fourth edition, R Oldenburg Verlag Munich-Vienna 1998, k is the Boltzmann constant T is the absolute temperature Q is the elementary charge and W1, W2 and W3 are the widths of the transistors M1, M2 and M3 respectively, in assuming that all transistors are the same in length.

When equating $(n \cdot k \cdot T)/q = 40$ mV, W1=W2 and W3=½·W1 then we have, for example:

$$V_{Hysteresis} = 40 \text{ mV} \cdot \ln 2 = 27.7 \text{ mV}. \quad (2)$$

Thus, the desired level of hysteresis is achievable by setting the width ratios of the transistors.

Figure 3:
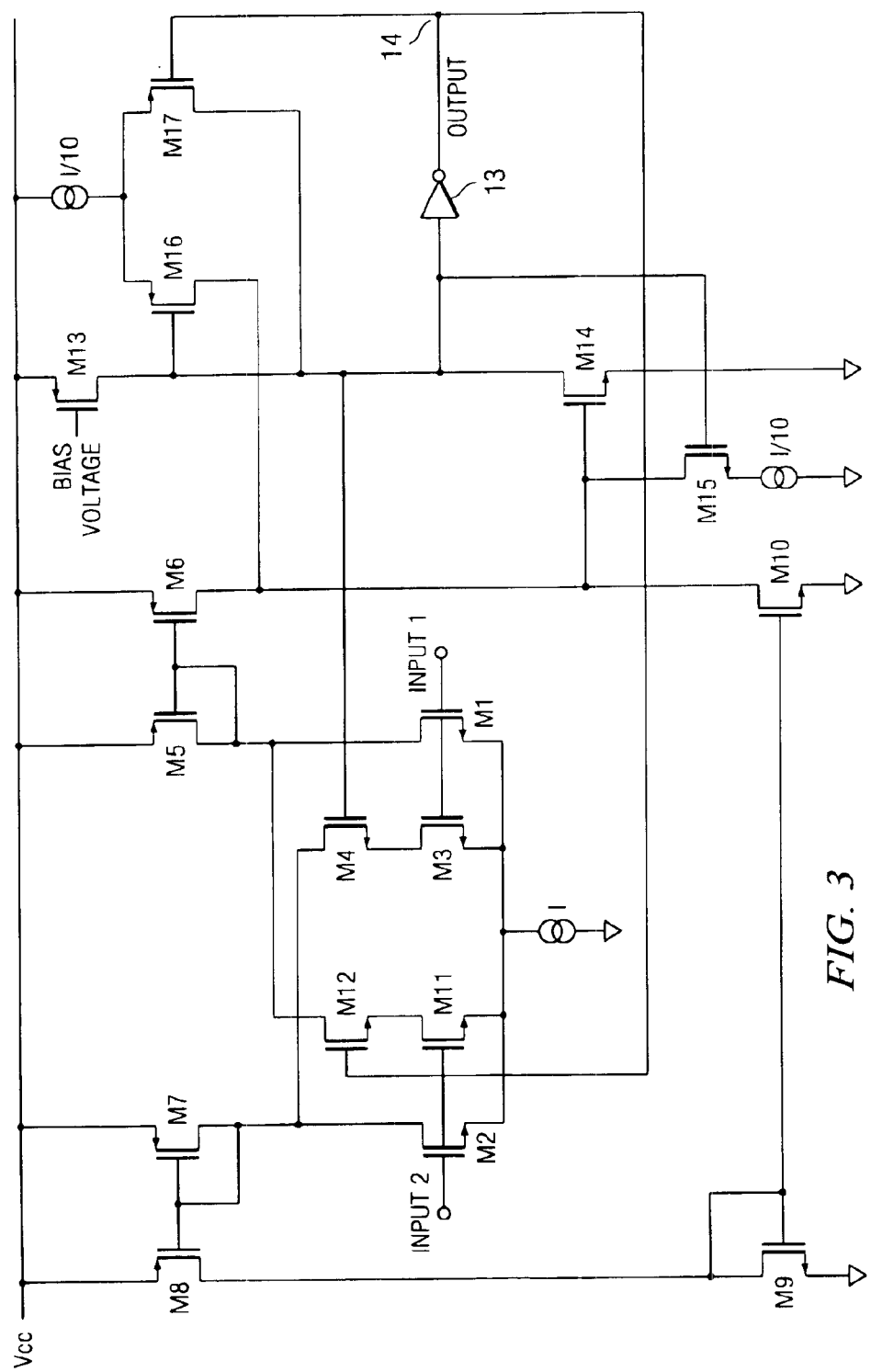
FIG. 3 is a circuit diagram of a second embodiment of a comparator with hysteresis in accordance with the invention.

Referring now to FIG. 3 there is illustrated a circuit diagram of a further embodiment of a comparator in accordance with the invention in which like elements as shown in FIG. 2 are identified by like reference numerals.

The main difference in the comparator as shown in FIG. 3 as compared to that as shown in FIG. 2 is that the hysteresis of the comparator as shown in FIG. 3 is symmetrical. This is achieved by two further MOS-FETs being provided, namely an eleventh MOS-FET M11 and a twelfth MOS-FET M12 in a mirror inverse arrangement to the MOS-FETs M3 and M4. In addition, this results in even faster switching as compared to prior art (see FIG. 1) and as compared to the embodiment of the invention as shown in FIG. 2, since in this condition none of the transistors is out of circuit and recharging the gate capacitances of the transistors M5, M6, M7 and M8 is eliminated. This achieves faster switching of the comparator for smaller currents as well as better results as calculated.

In this arrangement, the source of the eleventh MOS-FET M11 is connected to the source of the second MOS-FET M2 whilst its gate is connected to the gate of the second MOS-FET M2. The drain of the eleventh MOS-FET M11 is connected to the source of a twelfth MOS-FET M12 whose drain is connected to the drain of the first MOS-FET M1. The gate of the twelfth MOS-FET M12 is connected to the output 14 of the comparator. In addition, in the circuit of the arrangement as shown in FIG. 3 the second inverter 12 (see FIG. 2) is replaced by the two MOS-FETs M13 and M14.

The two switching points of the comparator with hysteresis as shown in FIG. 3 are given by the following equations:

switching point 1: (3)

$$V(input1 - input2) = 40mV * \ln\left(\frac{W2}{W1} * \left(1 - \frac{W3}{W1}\right)\right),$$

switching point 2: (4)

$$V(input2 - input1) = 40mV * \ln\left(\frac{W1}{W2} * \left(1 - \frac{W11}{W2}\right)\right),$$

it again having been assumed that (n 6 k 6 T)/q=40 mV, W1, W2, W3 and W11 are the widths of the transistors M1, M2, M3 and M11 respectively and that the length of all transistors is the same. Further, it was also assumed that the transistors are operated with weak inversion.

Provided in addition in FIG. 3 is a sub-circuit serving to lock the status of the output signal of comparator HI or LO should the voltages disappear at the inputs 1 and 2 of the comparator. The sub-circuit for locking the comparator status comprises MOS-FETs M15 (N type), M16 (P type) and M17 (P type) as well as the two current sources identified I/10 in FIG. 3 symbolizing that these comparators carry only a tenth of the current of current source 1. The sub-circuit for locking the comparator status was not taken into account in development of the aforementioned hysteresis equations (3) and (4).

A further embodiment of the invention would, of course, materialize by omitting transistors M3 and M4 from the embodiment as shown in FIG. 3.

Figure 4:
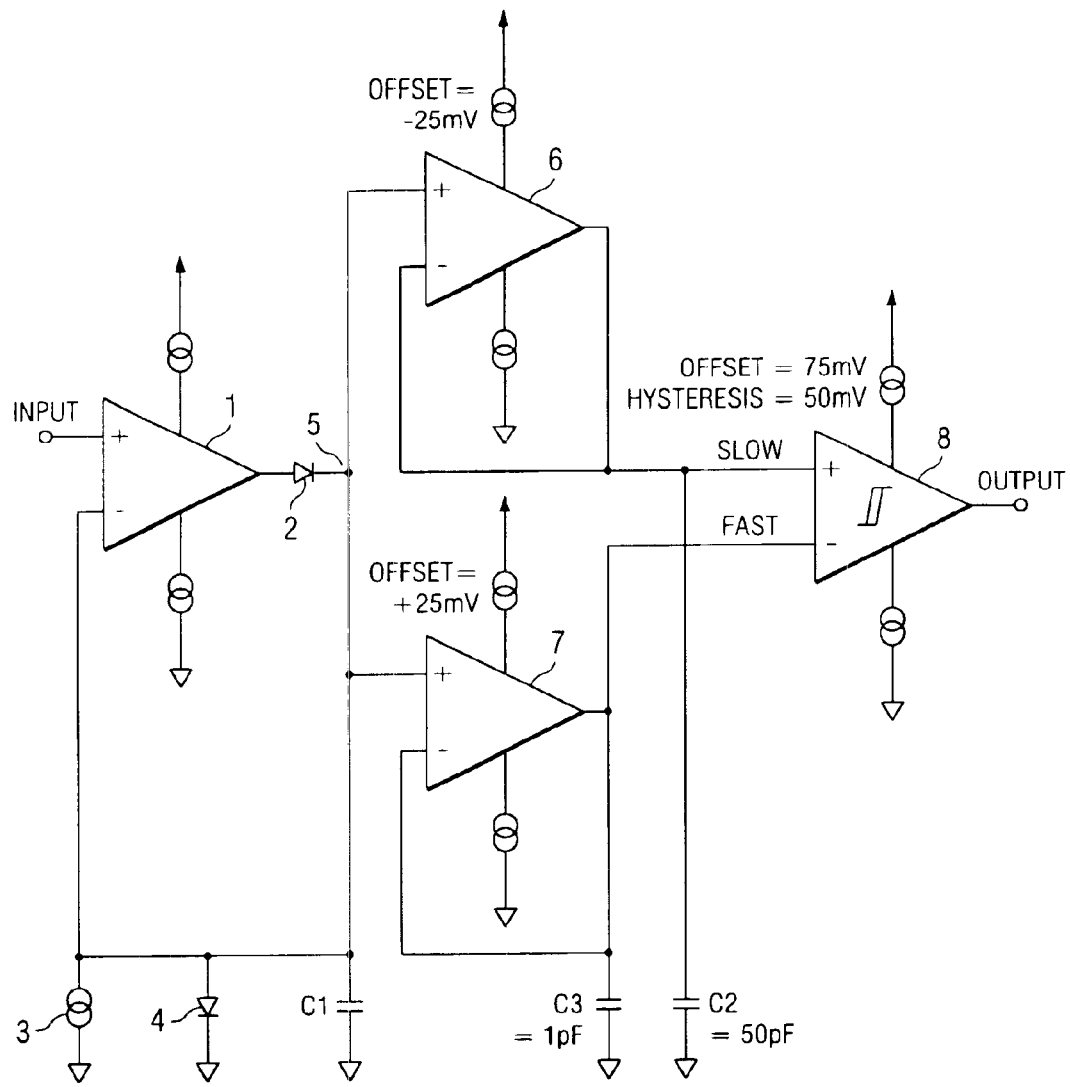
FIG. 4 is a circuit diagram of an ASK demodulator employing a comparator in accordance with the invention, and FIG. 5 are various graphs showing the signal profiles at various circuit points of the ASK demodulator as shown in FIG. 4.

Referring now to FIG. 4 there is illustrated an example application of the comparator in accordance with the invention.

Illustrated in FIG. 4 is the circuit diagram of an amplitude shift keyed (ASK) demodulator as may be put to use e.g. in a transponder which receives an ASK input signal which it coverts at its output into a digitally demodulated signal.

An automatic gain control (AGC) may be provided upstream of the input to the demodulator as shown in FIG. 4 to ensure that the voltage swing of the received modulated signal remains substantially constant.

Figure 5:
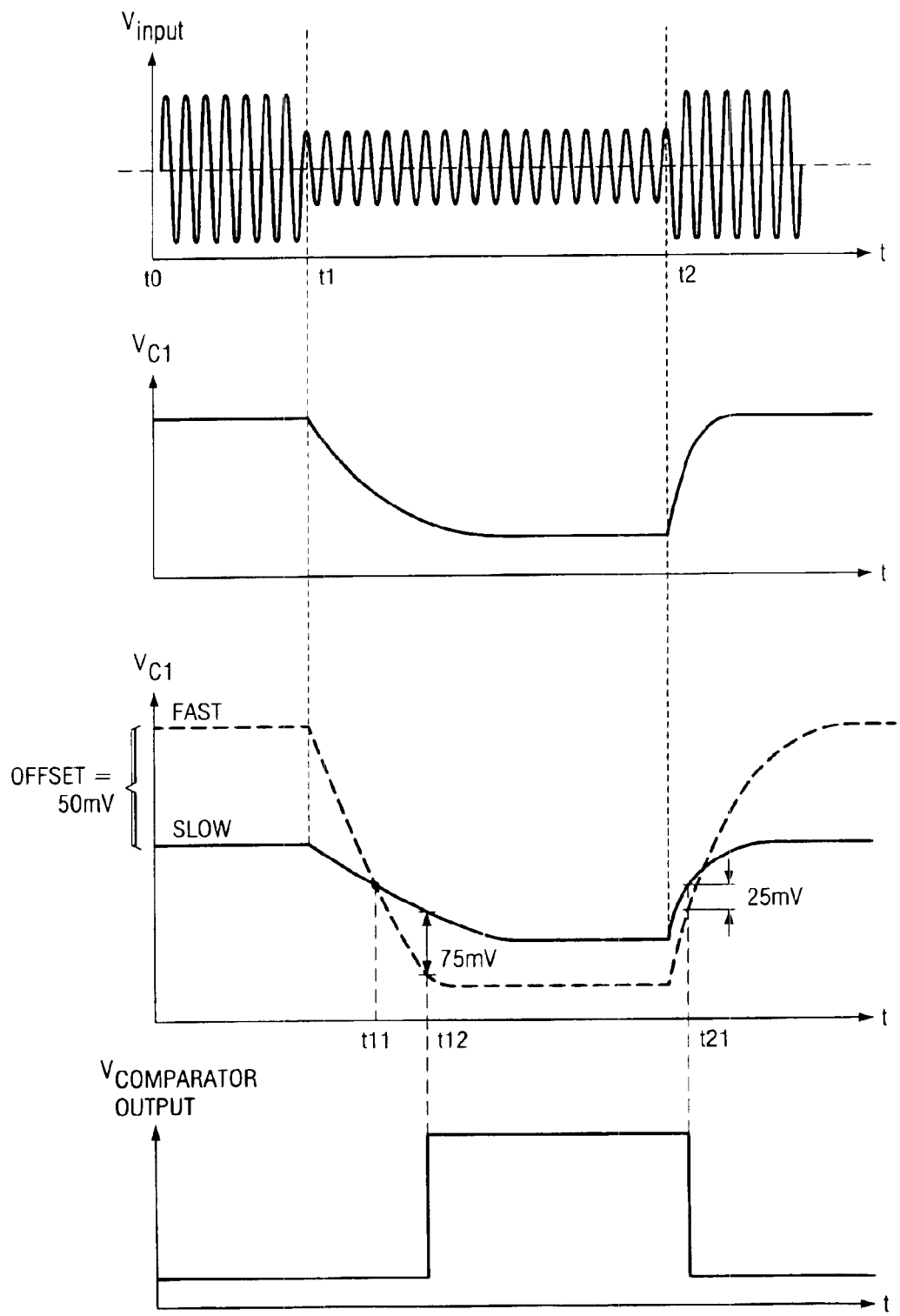

Referring now to FIG. 5 there are illustrated various voltage signals as occurring at various circuit points of the demodulator circuit as evident from FIG. 4 and will now be discussed for a better understanding of the circuit as shown in FIG. 4.

The demodulator as shown in FIG. 4 receives at its input ASK modulated signals in which the amplitude of a carrier oscillation has been switched between two states by a binary code signal. The frequency of the carrier oscillation may be e.g. 134 kHz. Referring now to FIG. 5a there is illustrated diagrammatically the signal received at the input of the demodulator, whereby the carrier oscillation of the input signal has an amplitude of high voltage level up to the point in time t1 which at point in time t1 is switched to a second lower voltage level representing e.g. the change in the digital status of the signal from 0 to 1. At point in time t2 the amplitude of the input signal is returned high.

The signal applied to the input of the demodulator is applied via a first voltage follower 1 and a rectifier diode 2 to a first capacitor C1 which is differingly charged/discharged as a function of the amplitude status of the input signal. A current source 3 is provided via which capacitor C1 is continually discharged by a defined current. The current source may be set e.g. to a current of 30 nA. By means of the rectifier arrangement (1, 2, 3, 5, C1) frequencies exceeding the modulation bit rate are filtered out.

Although a signal conditioning circuit is inserted between the antenna of the transponder and the input of the demodulator circuit as shown in FIG. 4 to ensure that the maximum voltage swing of the input signal remains substantially constant, voltage spikes may appear at the input since the voltage level of the signals received by a reader at input of the transponder may fluctuate very strongly as may be caused by the distance between reader and transponder varying. To minimize the response delay of the signal conditioning circuit connected to the input of the demodulator as shown in FIG. 4 a clamping diode 4 is provided which is connected to the capacitor C1 and ensures that the output voltage of the rectifier appearing at circuit point 5 is clamped so that it cannot exceed critical voltage values. For the clamping diode 4 a NMOS-FET circuited as a diode may be used, for example.

Referring now to FIG. 5b) there is illustrated the rectified voltage signal as it appears at circuit point 5 and as applied to the capacitor C1. Should the amplitude of the ASK input signal drop from a high to a low level at the point in time t1, the voltage across the capacitor C1 falls, capacitor C1 being gradually discharged via the current source 3. Should the amplitude of the input signal re-increase at the point in time t2 capacitor C1 is re-charged to its original level?

The signal applied to the circuit point 5 is connected to the input of a second voltage follower 6 and to the input of a third voltage follower 7. The output of the second voltage follower 6 is connected to a second capacitor C2 of relatively large capacitance, 50 pF. The output of the third voltage follower 7 is connected to a third capacitor C2 of relatively small capacitance, 1 pF which is smaller than the capacitance of the second capacitor C2.

Since the capacitance of the second capacitor C2 is substantially larger than the capacitance of the third capacitor C2, changes in the voltage appearing at circuit point 5 are followed by the second capacitor C2 driven by the second voltage follower 6 much slower than by the third capacitor C2 driven by the third voltage follower 7.

The output of the second voltage follower 6 is, in addition, connected to the first input of a comparator 8 in accordance with the invention whose other input is connected to the output of the third voltage follower 7.

To take signal noise into account, the comparator must be set with sufficient hysteresis. The hysteresis may be e.g. 50 mV as computed by means of the above equations (1)–(4). In addition, an offset voltage of e.g. –75 mV exists between the inputs of the comparator. To further increase the offset between the "slow output signal" of the second voltage follower 6 and the "fast output signal" of the third voltage follower 7 each of the two voltage followers may feature a further offset voltage amounting to e.g. –25 mV for the second voltage follower and +25 mV for the third voltage follower in supporting the comparator offset. In the comparators in accordance with the invention an offset can never materialize which exceeds a critical maximum permissible value so that by necessity a certain proportion of the offset needs to be distributed to the two voltage followers 6 and 7 to achieve a sufficient output voltage spacing (see FIG. 5c) between the "fast 5 output signal" and the "slow output signal".

Referring now to FIG. 5c there are illustrated the voltages as applied to the inputs of the comparator 8 in accordance with the invention. In this arrangement the voltage applied to capacitor C3 is identified "fast" since this capacitor has a relatively small capacitance and can thus be charged and discharged relatively quickly by the third voltage follower 7 in being able to quickly follow changes in the level of the ASK input signal. The output signal applied to the second capacitor C2 is identified "slow" since this capacitance has a relatively large capacitance and can thus only be charged and discharged relatively slowly by the second voltage follower 6 and is only able to slowly follow changes in the level of the ASK input signal.

Identified in addition is the offset of 50 mV of the two voltage followers which ensures that the comparator 8 "sees" the signals at C3 and C2 so that a difference of 50 mV exists between them at the point in time t0.

As soon as the voltage at the capacitor C1 drops at point in time t1, the voltage at the "fast" input of the comparator 8, which is at a voltage level 50 mV higher than the "slow" input, drops relatively quickly since capacitor C3 is discharged relatively quickly via the third voltage follower 7. Capacitor C2 and thus the voltage applied to the "slow" input of the comparator 8 is reduced only relatively slowly, as is evident from FIG. 5c). At some point in time (t11) the voltage applied to the "fast" input of the comparator 8 drops below the voltage applied to the "slow" input of the comparator, it not being until after a further time interval, at point in time t12, due to the −75 mV offset of the comparator, that the output signal at the output of the comparator 8 and thus of the demodulator changes from LO to HI. 30

Then, at point in time t2, when the level of the ASK signal at the input of the demodulator again increases, capacitor C3 is quickly charged and capacitor C2 slowly charged. Once (at point in time t21) the voltage applied to the "fast" input of the comparator 8 in accordance with the invention has approached to within 25 mV the voltage at the "slow" input of the comparator 8, the comparator is again switched. The value of −25 mV materializes from the sum of the offset (−75 mV) of the comparator and the hysteresis (50 mV).

It will be appreciated that the ASK demodulator as described is, of course, just one example from a wealth of possible applications of the comparator in accordance with the invention, especially when circuits need to be achieved having low operating voltages and low current consumption requiring a fast switching comparator.

The comparator in accordance with the invention may, of course, be achieved in making use of other types of transistors. For instance, bipolar transistors may be used, in which case the main current paths not being the source-drain circuits of the transistors but the emitter-collector circuits in the embodiments as shown in FIGS. 2–3.

What is claimed is:

1. A comparator with hysteresis comprising a first transistor (M1) whose gate forms the one input of the comparator and a second transistor (M2) whose gate forms the other input of the comparator, the main current paths of both transistors (M1, M2) being connected to each other at one end, characterized by a third transistor (M3) and a fourth transistor (M4) being provided, the gate of said third transistor (M3) being connected to the gate of said first transistor (M1) and the main current path of said third transistor being connected between the one end of the main current paths of said first and second transistor (M1, M2) and connected via the main current path of said fourth transistor (M4) to the other end of said main current path of said second transistor (M2), and the gate of said fourth transistor being connected to the output signal or inverted output signal of said comparator.

2. The comparator as set forth in claim 1 wherein said transistors (M1, M2, M3, M4) are bipolar transistors.

3. The comparator as set forth in claim 1 wherein said transistors (M1, M2, M3, M4) are MOS-FETs.

4. The comparator as set forth in claim 3 wherein the width/length ratio of said first transistor (M1) is larger than the width/length ratio of said third transistor (M3).

5. The comparator as set forth in claim 4 comprising, in addition, a fifth transistor (M11) and a sixth transistor (M12), the gate of said fifth transistor (M11) being connected to the gate of said second transistor (M2) and the main current path being connected between the one end of the main current paths of said first and said second transistor (M1, M2) and via the main current path of said sixth transistor (M12) to the other end of the main current path of said first transistor (M1), and the gate of said sixth transistor (M12) being connected to the output signal of said comparator when the gate of said fourth transistor (M4) is connected to the inverted output signal of said comparator, and the gate of said sixth transistor (M12) being connected to the inverted output signal of said comparator when the gate of said fourth transistor (M4) is connected to the output signal of said comparator.

6. The comparator as set forth in claim 1 comprising, in addition, a fifth transistor (M11) and a sixth transistor (M12), the gate of said fifth transistor (M11) being connected to the gate of said second transistor (M2) and the main current path being connected between the one end of the main current paths of said first and said second transistor (M1, M2) and via the main current path of said sixth transistor (M12) to the other end of the main current path of said first transistor (M1), and the gate of said sixth transistor (M12) being connected to the output signal of said comparator when the gate of said fourth transistor (M4) is connected to the inverted output signal of said comparator, and the gate of said sixth transistor (M12) being connected to the inverted output signal of said comparator when the gate of said fourth transistor (M4) is connected to the output signal of said comparator.

7. The comparator as set forth in claim 6 wherein, in addition, a sub-circuit is provided which ensures that said status of the output signal of said comparator is locked even when the voltage level at the one and/or other input of said comparator disappears.

8. The comparator as set forth in claim 6 wherein the one end of said main current paths of said first transistor and of said second transistor is connected to a current source.

9. The comparator as set forth in claim 6 wherein the one end of said main current path of said first transistor and the main current path of said second transistor is connected in each case via the main current path of the other transistors to a supply voltage.

10. An ASK demodulator comprising a comparator with hysteresis, comprising:

a first transistor (M1) whose gate forms the one input of the comparator and a second transistor (M2) whose gate forms the other input of the comparator, the main current paths of both transistors (M1, M2) being connected to each other at one end, characterized by a third transistor (M3) and a fourth transistor (M4) being provided, the gate of said third transistor (M3) being connected to the gate of said first transistor (M1) and the main current path of said third transistor being connected between the one end of the main current paths of said first and second transistor (M1, M2) and connected via the main current path of said fourth transistor (M4) to the other end of said main current path of said second transistor (M2), and the gate of said fourth transistor being connected to the output signal or inverted output signal of said comparator.

11. The ASK demodulator as set forth in claim 10 further comprising, a rectifier (2, C1) whose output (5) is connected to a first voltage follower (6) whose output is connected to a first capacitor (C2) and the output of the rectifier is connected to a second voltage follower (7) whose output is connected to a second capacitor (C3), the capacitance of which is smaller than the capacitance of said first capacitor (C2), said first capacitor (C2) being connected to the one input and said second capacitor (C3) being connected to the other input of said comparator (8).

12. The ASK demodulator as set forth in claim 11 wherein said two voltage followers (6, 7) each comprise opposing offset voltages.

13. The ASK demodulator as set forth in claim 12 wherein said comparator (8) comprises an offset voltage.

* * * * *